(12) United States Patent
Xing et al.

(10) Patent No.: US 6,171,970 B1
(45) Date of Patent: Jan. 9, 2001

(54) METHOD FOR FORMING HIGH-DENSITY INTEGRATED CIRCUIT CAPACITORS

(75) Inventors: Guoqiang Xing, Plano, TX (US); Abbas Ali, Chatsworth, CA (US); Theodore S. Moise, Dallas, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/238,211

(22) Filed: Jan. 27, 1999

Related U.S. Application Data

(60) Provisional application No. 60/072,774, filed on Jan. 27, 1998.

(51) Int. Cl.[7] .................................................. H01L 21/3065
(52) U.S. Cl. ........................ 438/706; 438/710; 438/712; 438/720
(58) Field of Search ..................................... 438/706, 710, 438/711, 712, 719, 720, 396, 240, 253; 257/377

(56) References Cited

U.S. PATENT DOCUMENTS

| | | | |
|---|---|---|---|
| 5,477,074 | * 12/1995 | Yen | 257/377 |
| 5,591,302 | * 1/1997 | Shinohara et al. | 156/661.11 |
| 5,930,639 | * 7/1999 | Schuele et al. | 438/396 |
| 5,972,722 | * 10/1999 | Visokay et al. | 438/3 |

* cited by examiner

*Primary Examiner*—Robert Kunemund
*Assistant Examiner*—Lan Vinh
(74) *Attorney, Agent, or Firm*—Jacqueline J. Garner; W. James Brady, III; Frederick J. Telecky, Jr.

(57) ABSTRACT

A method for etching a platinum surface 200. The method includes the step of forming a hardmask 202 including titanium, aluminum, and nitrogen on the platinum surface. The hardmask covers portions of the platinum surface. The method further includes removing platinum from uncovered portions of the surface with a plasma including a nitrogen-bearing species. The etch chemistry may also comprise an oxygen-bearing species.

8 Claims, 10 Drawing Sheets

METHOD FOR FORMING HIGH-DENSITY INTEGRATED CIRCUIT CAPACITORS

This application claims priority under 35 USC §119 (e)(1) of provisional application number 60/072,774, filed Jan. 27, 1998.

FIELD OF THE INVENTION

This invention relates to semiconductor integrated circuits, and more specifically to dynamic random access memory storage capacitors.

BACKGROUND OF THE INVENTION

Increasing demand for semiconductor memory and competitive pressures require higher density integrated circuit dynamic random access memories (DRAMs) based on one-transistor, one-capacitor memory cells. But scaling down capacitors with the standard silicon oxide and nitride dielectric presents problems including decreasing the quantity of charge that may be stored in a cell. Consequently, alternative dielectrics with dielectric constants greater than those of silicon oxide and nitride are being investigated. Various dielectric materials are available, such as tantalum pentoxide (dielectric constant about 25 versus silicon nitride's dielectric constant of about 7) as described in Ohji et al., "$Ta_2O_5$ capacitors' dielectric material for Giga-bit DRAMs," IEEE IEDM Tech. Dig. 5.1.1 (1995); lead zirconate titanate (PZT), which is a ferroelectric and supports nonvolatile charge storage (dielectric constant of about 1000), described in Nakamura et al., "Preparation of $Pb(Zr,Ti)O_3$ thin films on electrodes including $IrO_2$, 65 Appl. Phys. Lett. 1522 (1994); strontium bismuth tantalate (also a ferroelectric) described in Jiang et al. "A New Electrode Technology for High-Density Nonvolatile Ferroelectric ($SrBi_2Ta_2O_9$) Memories," VLSI Tech. Symp. 26 (1996); and barium strontium titanate (dielectric constant about 500), described in Yamamichi et al., "An ECR MOCVD $(Ba,Sr)TiO_3$ based stacked capacitor technology with $RuO_2/Ru/TiN/TiSi_x$ storage nodes for Gbit-scale DRAMs," IEEE IEDM Tech. Dig. 5.3.1 (1995), Yuuki et al., "Novel Stacked Capacitor Technology for 1 Gbit DRAMs with CVD-$(Ba,Sr)TiO_3$ Thin Films on a Thick Storage Node of Ru," IEEE IEDM Tech. Dig. 5.2.1 (1995), and Park et al., "A Stack Capacitor Technology with $(Ba,Sr)TiO_3$ Dielectrics and Pt Electrodes for 1 Giga-Bit density DRAM, VLSI Tech. Symp. 24 (1996). Also see Dietz et al., "Electrode influence on the charge transport through $SrTiO_3$. thin films, 78 J. Appl. Phys. 6113 (1995), (describes electrodes of Pt, Pd, Au, and so forth on strontium titanate); U.S. Pat. No. 5,003,428 (PZT and barium titanate), U.S. Pat. No. 5,418,388 (BST, $SrTiO_3$, PZT, etc.), and U.S. Pat. No. 5,566,045 (thin Pt on BST).

These alternative dielectrics are typically deposited at elevated temperatures and in an oxidizing ambient. Hence, an oxygen-stable bottom electrode material such as platinum or ruthenium oxide is used. Platinum exhibits the best leakage characteristics in capacitor structure and therefore is the subject of extensive study for integration into DRAM process flows. Platinum, however, readily forms a silicide when in direct contact with silicon, and further is not a good barrier to oxygen due to fast diffusion down the platinum grain boundaries. A further difficulty with platinum is that it has proven difficult to etch with a dry process. Such a dry process will be instrumental in achieving the wafer throughput necessary to justify integration of platinum into commodity products such as DRAMs.

Past dry etching efforts have focused on reactive ion etching (RIE) using chemistries that include argon, chlorine, $SF_6$, and $CF_4$. See C.E. Farrell, et al., "A Reactive Ion Etch Study for Producing Patterned Platinum Structures," Integrated Ferroelectrics, vol. 16, pp. 109–138, 1997; and K. R. Milkove and C. X. Wang, "Analysis of a Fence-free Platinum Etch Process," Integrated Ferroelectrics, vol. 17, pp. 403–419, 1997. These prior art processes have thus far achieved disappointing results. The challenge in this technology is to form platinum pedestals (bottom capacitor electrodes) having a height on the order of 0.3 um and a minimum lateral dimension of between 0.1 um and 0.2 um. The pitch between electrodes will also be on the order of the minimum feature size. To achieve the packing density and capacitance required in the 1 Gigabit DRAM generation and beyond, the sidewalls of the platinum bottom electrode will be between 80° and 90° relative to the surface on which the pedestal is formed. See FIG. 1. The prior art processes mentioned above produce sidewall angles that are typically less than 40° using dry-etching only, and less than 70° when the dry etch is followed by a wet cleanup etch. Milkove and Wang, in "Insight into the dry etching of fence-free patterned platinum structures", J. Vac. Sci. Technol. A 15(3), May/Jun 1997, pp. 596–603, attribute the shallow sidewall angles to a combination of fence formation on the photoresist mask and lateral mask erosion. The fence formation is a result of redeposited platinum, and is believed to be the dominant factor in determining sidewall angle.

SUMMARY OF THE INVENTION

In accordance with a preferred embodiment of the invention, there is disclosed a method for etching a platinum surface. The method includes the step of forming a hardmask including titanium, aluminum, and nitrogen on the platinum surface. The hardmask covers portions of the platinum surface. The method further includes removing platinum from uncovered portions of the surface with a plasma including a nitrogen-bearing species. The etch chemistry may also comprise an oxygen-bearing species.

In accordance with another preferred embodiment of the invention, there is disclosed a method for forming a capacitor electrode. The method includes the steps of forming a platinum layer on a substrate and forming a hardmask including titanium, aluminum, and nitrogen on the platinum layer. The hardmask covers portions of the platinum layer. The method also includes the step of etching uncovered portions of the platinum layer in a plasma etcher with a plasma including a nitrogen-bearing species. The etch chemistry may also comprise an oxygen-bearing species.

An advantage of the inventive concepts is that platinum, which has historically been difficult to pattern and etch, is capable of being etched to fine features and with steep sidewall profiles. The nitrogen in the etch chemistry combines with the hardmask to reduce erosion of the hardmask during etching of the platinum.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Platinum Etching

Figure 1:
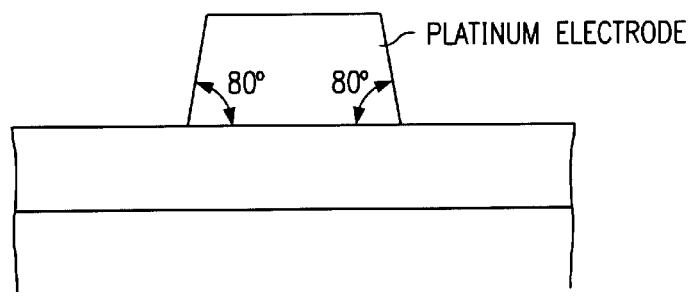
FIG. 1 is a diagram showing the critical angle for platinum DRAM cell capacitor electrodes.
Figure 2A:
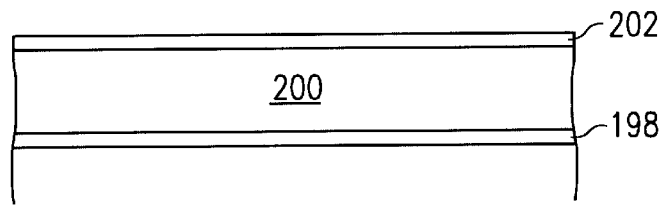
FIGS. 2a to 2e are cross-sectional diagrams at various stages of a process for forming platinum electrodes.
Figure 2B:
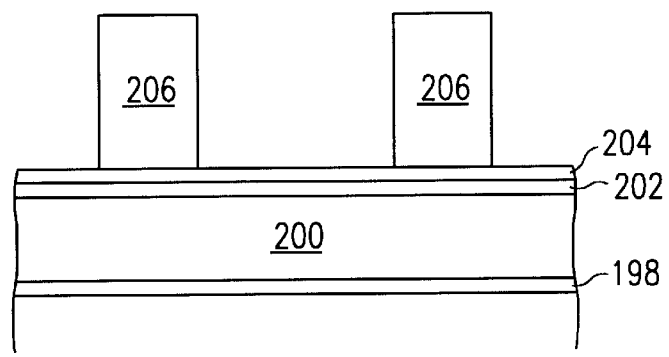
Figure 2C:
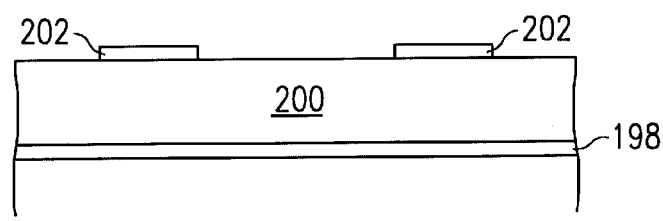
Figure 2D:
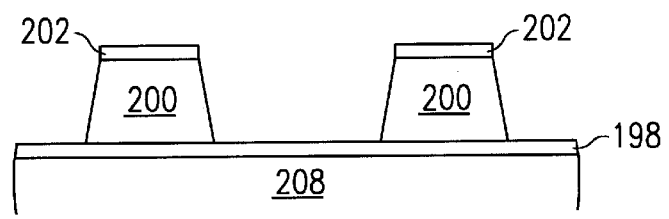
Figure 2E:
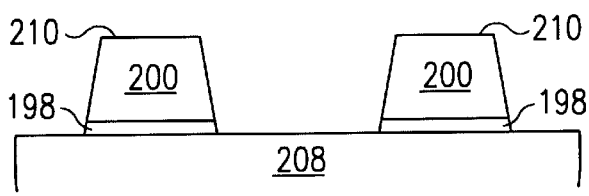

Platinum as a noble metal, its oxides, and Pt-halogen compounds all have very low volatility at the temperatures commonly used in dry etch processes. Prior art etch processes are predominantly physical etches (as opposed to reactive or chemical etches). This results in low etch rate, low etch selectivity to photoresist and to silicon oxide or silicon nitride, and the formation of transient sidewall fences due to platinum redeposition on the mask during etching. This redeposition is one of the mechanisms limiting the platinum sidewall profile to relatively shallow angles in prior art processes that use photoresist masking. An alternative to photoresist masks is the use of so-called hardmasks, such as Ti—Al—N, Ti—N, $SiO_2$, $Si_3N_4$, and so forth. Ti—Al—N, in particular, has proven to be an effective hardmask material for the etching of platinum; see co-assigned patent application 60/051,408 (Texas Instruments Inc. docket number TI-25297), hereby incorporated by reference.

Despite the effectiveness of Ti—Al—N as a masking material, the sidewall angles achieved with argon, chlorine, and oxygen-based etch chemistries are still approximately 70 degrees or less. Applicant has found, however, that the addition of a nitrogen-bearing species to the etch plasma increases the sidewall angle to approximately 80 degrees, the minimum acceptable angle.

One embodiment in accordance with the invention may be performed as described below and as shown in FIGS. 2a to 2e. The notation used herein in the form "A-B-C" indicates that the material may exist in varying compositions of the elements A, B, and C, an example being "Si—O—N".

a) Deposit a 300 nm thick layer of platinum 200 over a barrier layer of $(Ti_{0.7}Al_{0.3})$—N 198 having a thickness of 20 nm or less. Deposit a 50 nm thick hardmask layer of $(Ti_{0.7}Al_{0.3})$—N 202 over platinum 200. The Ti—Al—N layers 198 and 202 are formed, for example, by sputtering a TiAl target in an $N_2$ ambient. See FIG. 2a. Note that the layer thicknesses may vary considerably from the thicknesses given here. For example, the hardmask layer thickness may be in the range from approximately 20 nm to 200 nm, depending upon the etch conditions and desired feature size. Note also that the hardmask and barrier layers may alternatively comprise TiN, Ti, $TiO_2$, and so forth.

b) Deposit an anti-reflection coating (ARC) layer 204 (SiON or an organic layer for example) over the Ti—Al—N layer 202, followed by photoresist 206. Pattern the photoresist to define the locations of the subsequently formed platinum electrodes. See FIG. 2b.

c) Remove the exposed ARC layer 204. Etch the Ti—Al—N layer 202 left uncovered by the photoresist and ARC layer using a relatively high pressure, low-RF bias (less than approximately 500 W, for example), chlorine-based plasma (a $Cl_2$/Ar plasma, for example). This etch is performed in a helicon or electron cyclotron resonance high density plasma etcher, for example, under the following conditions: pressure 5.0 mTorr, source power 1500 W, RF bias power 250 W, $Cl_2$ flow rate of 40 sccm.

d) Ash the remaining photoresist 206 in an $O_2$ plasma under the following conditions: pressure 2.5 mTorr, source power 2500 W, RF bias power 100 W, $O_2$ flow rate of 50 sccm, Ar flow rate of 50 sccm, and $Cl_2$ flow rate of 3 sccm. The ash step exposes the Ti—Al—N layer 202 to oxygen. The oxygen combines with the aluminum and titanium in the hardmask layer to form aluminum oxide and titanium oxide, which act as a self-passivation layer for the hardmask during the subsequent platinum etch. See FIG. 2c.

e) Etch the platinum layer 200 left uncovered by the Ti—Al—N layer 202 using a relatively low pressure, high-RF bias (greater than approximately 500 W, for example), nitrogen-based plasma. See FIG. 2d. This etch is performed in a helicon or electron cyclotron resonance high density plasma etcher, for example, under the following conditions: pressure 2.5 mTorr, source power 2000 W, RF bias power 700 W, $N_2$ flow rate of 20 sccm, $Cl_2$ flow rate of 10 sccm, and $O_2$ flow rate of 10 sccm. The etch stops on the barrier layer 198.

Note that the nitrogen in the etch chemistry is not inert. The Ti—Al—N layer 202 is non-stoichiometric (e.g. possibly nitrogen-deficient) and is vulnerable to erosion with chemistries that do not contain nitrogen, such as $Ar/Cl_2$ or $Ar/O_2/Cl_2$ for example. On the other hand, nitrogen introduced into the etch chamber hardens the Ti—Al—N layer 202 against erosion. The nitrogen appears to replace nitrogen that is lost from the surface of the Ti—Al—N hardmask from sputtering of the hardmask surface caused by the etching of the platinum layer. As described above in the ash step, oxygen is also beneficial in hardening the Ti—Al—N hardmask. As the platinum etch sputters the surface of the Ti—Al—N hardmask, the aluminum oxide and titanium oxide surface layer formed in the ash step described above may deteriorate, allowing the hardmask to pit and erode. Thus, it is beneficial to also include oxygen in the platinum etch chemistry to provide a continuos reformation of the protective oxide layer as the sputtering of the hardmask surface occurs. The platinum etch chemistry may therefore be considered to include two mask-hardening agents, nitrogen and oxygen.

f) Etch the remaining Ti—Al—N hardmask layer 202 and the exposed barrier layer 198 using the etch conditions described above in step c). Following the removal of the hardmask, platinum pedestals 210 remain of the original platinum layer 200. Note that the layer or substrate 208 underlying the barrier layer 198 may be an interlayer dielectric such as silicon oxide or silicon nitride, or a semiconductor such as silicon, for example.

DRAM Cells

Figure 3A:
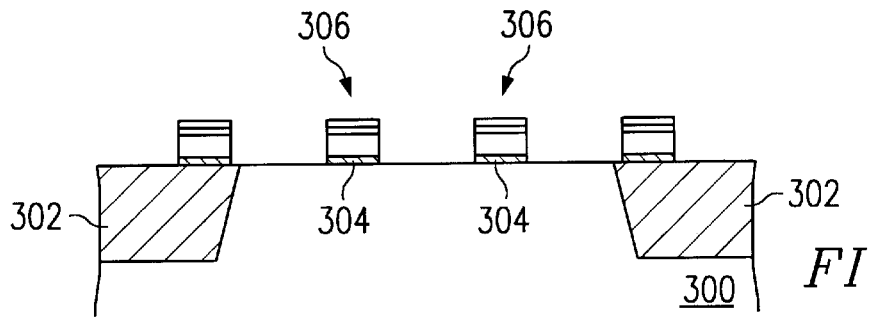
FIGS. 3a to 3o are cross-sectional diagrams at various stages of a process for forming a capacitor-over-bitline DRAM cell.
Figure 3B:
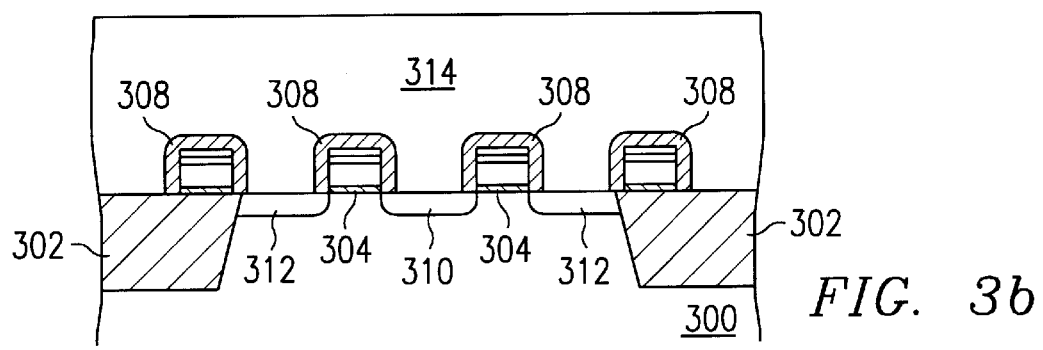
Figure 3C:
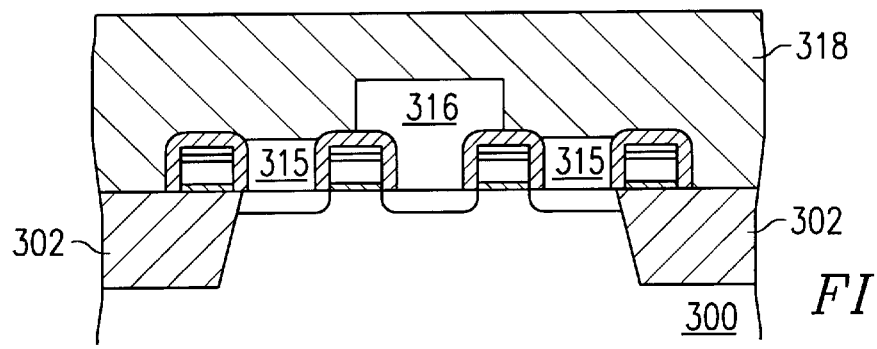
Figure 3D:
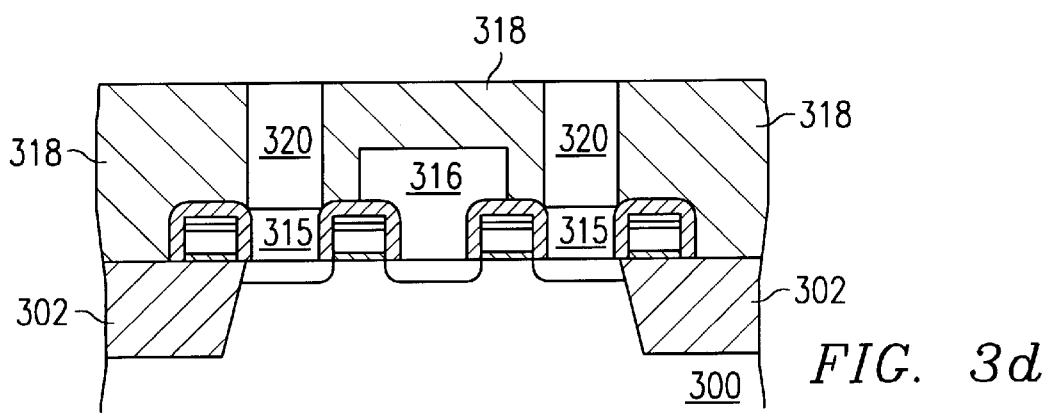
Figure 3E:
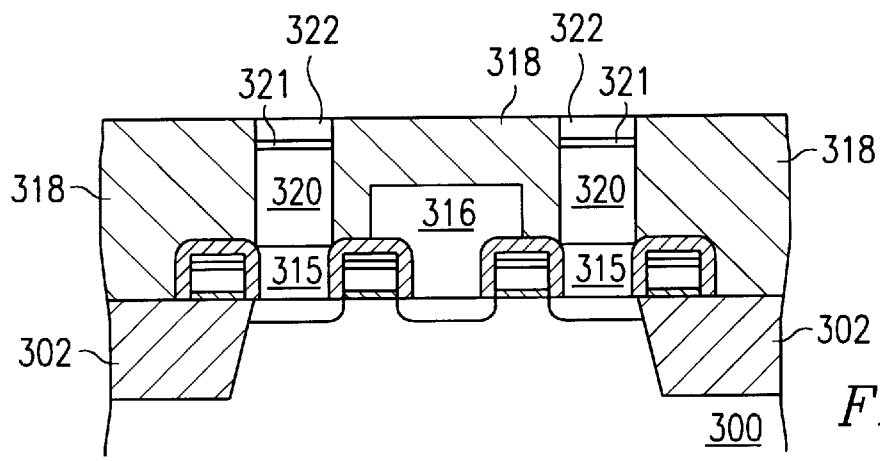
Figure 3F:
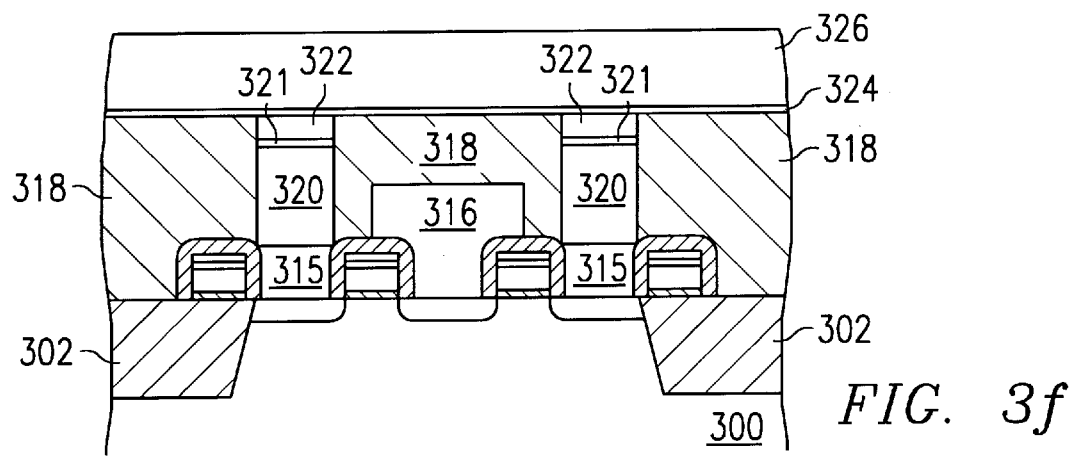
Figure 3G:
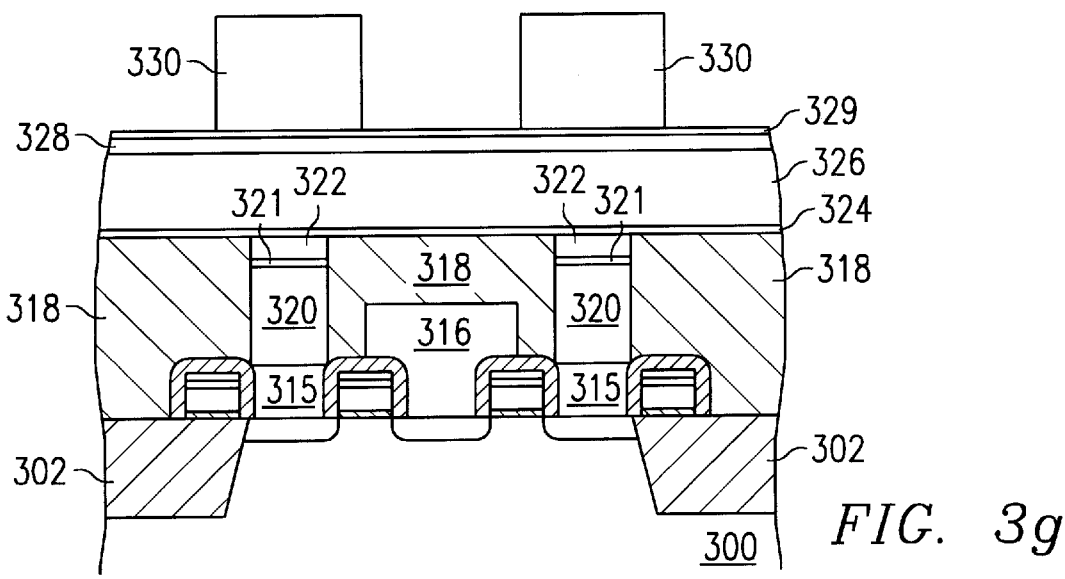
Figure 3H:
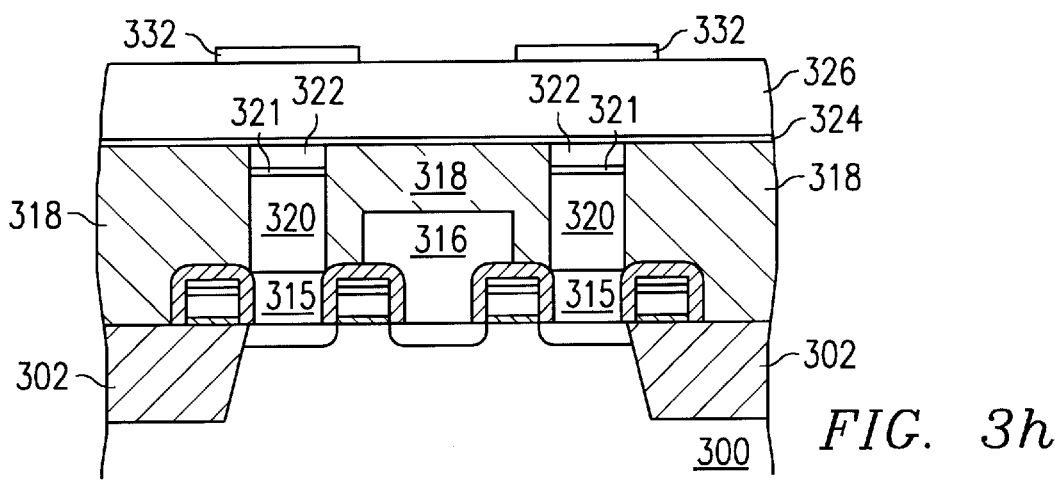
Figure 3I:
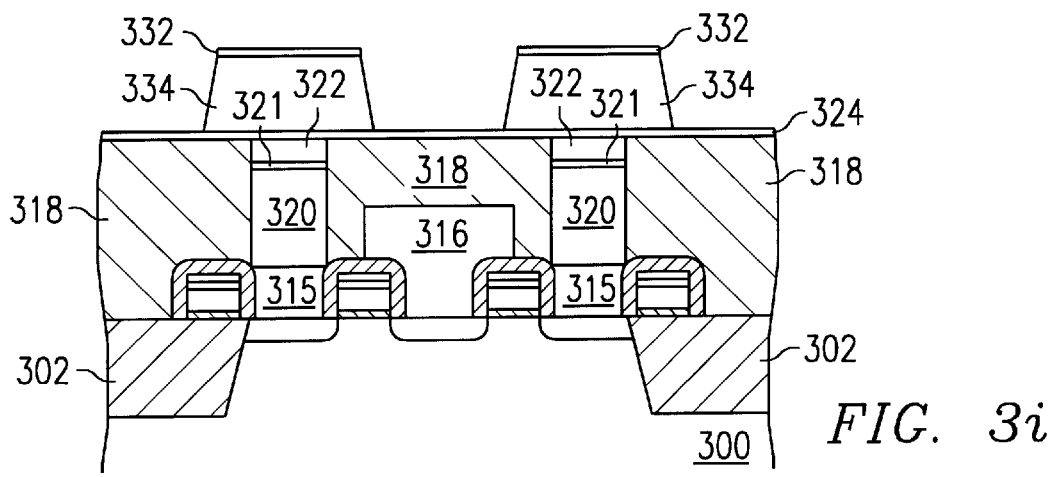
Figure 3J:
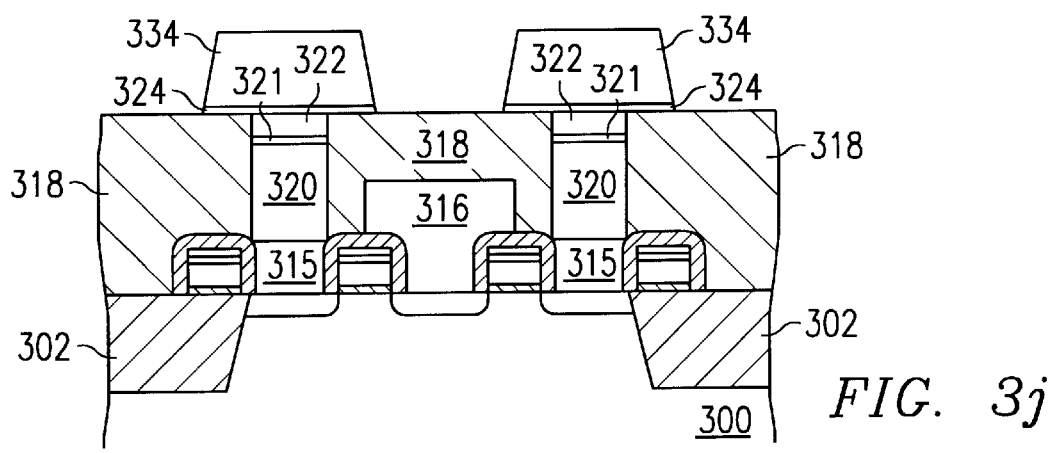
Figure 3K:
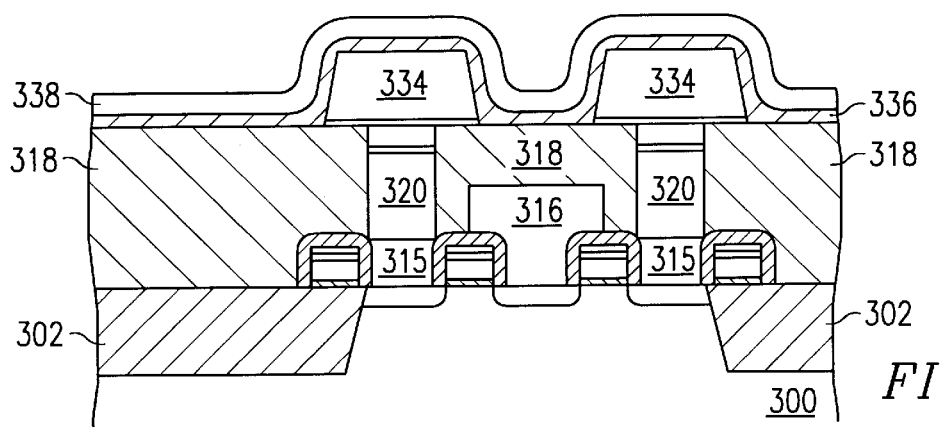
Figure 3L:
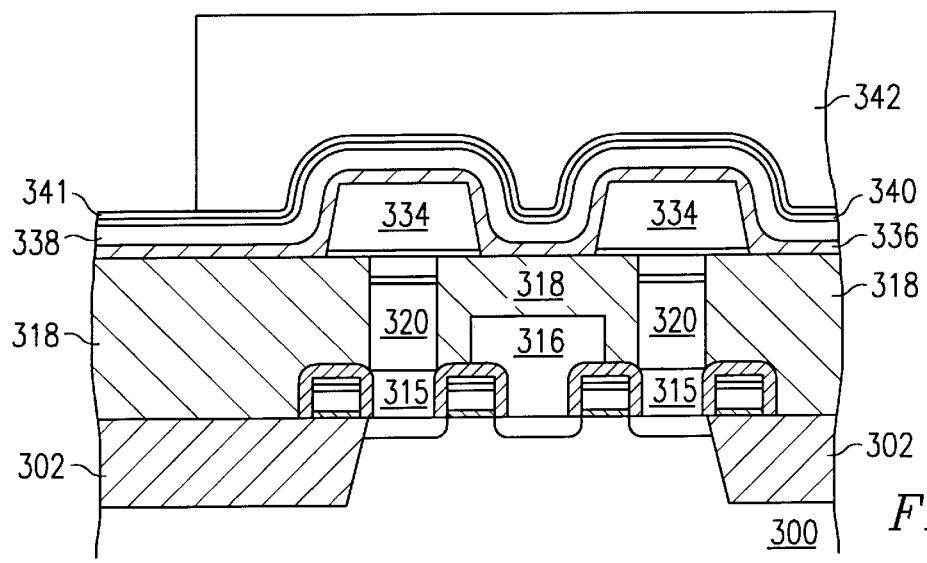
Figure 3M:
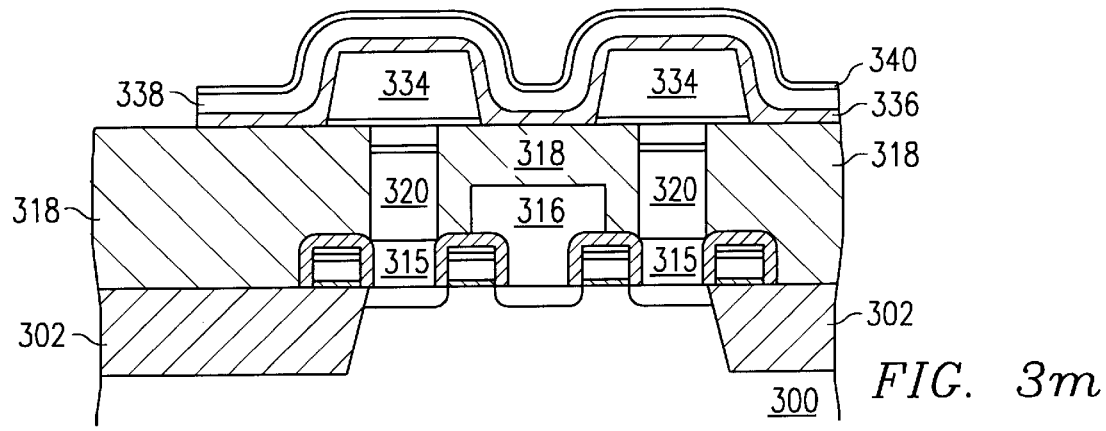
Figure 3N:
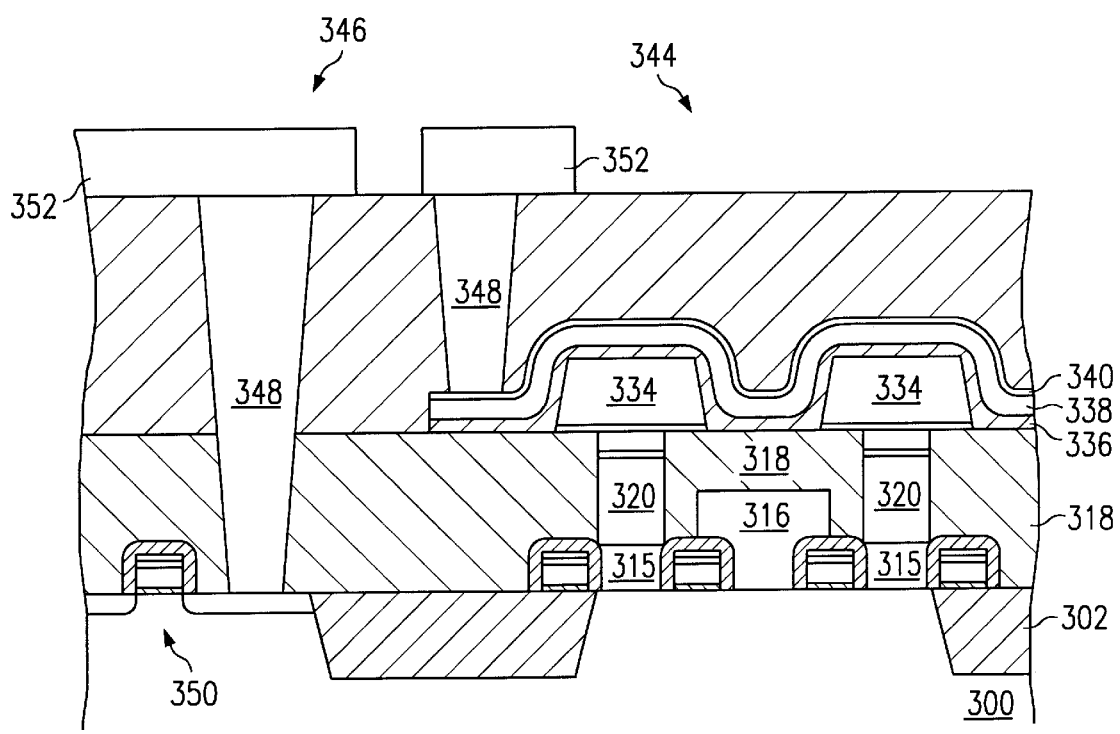
Figure 3O:
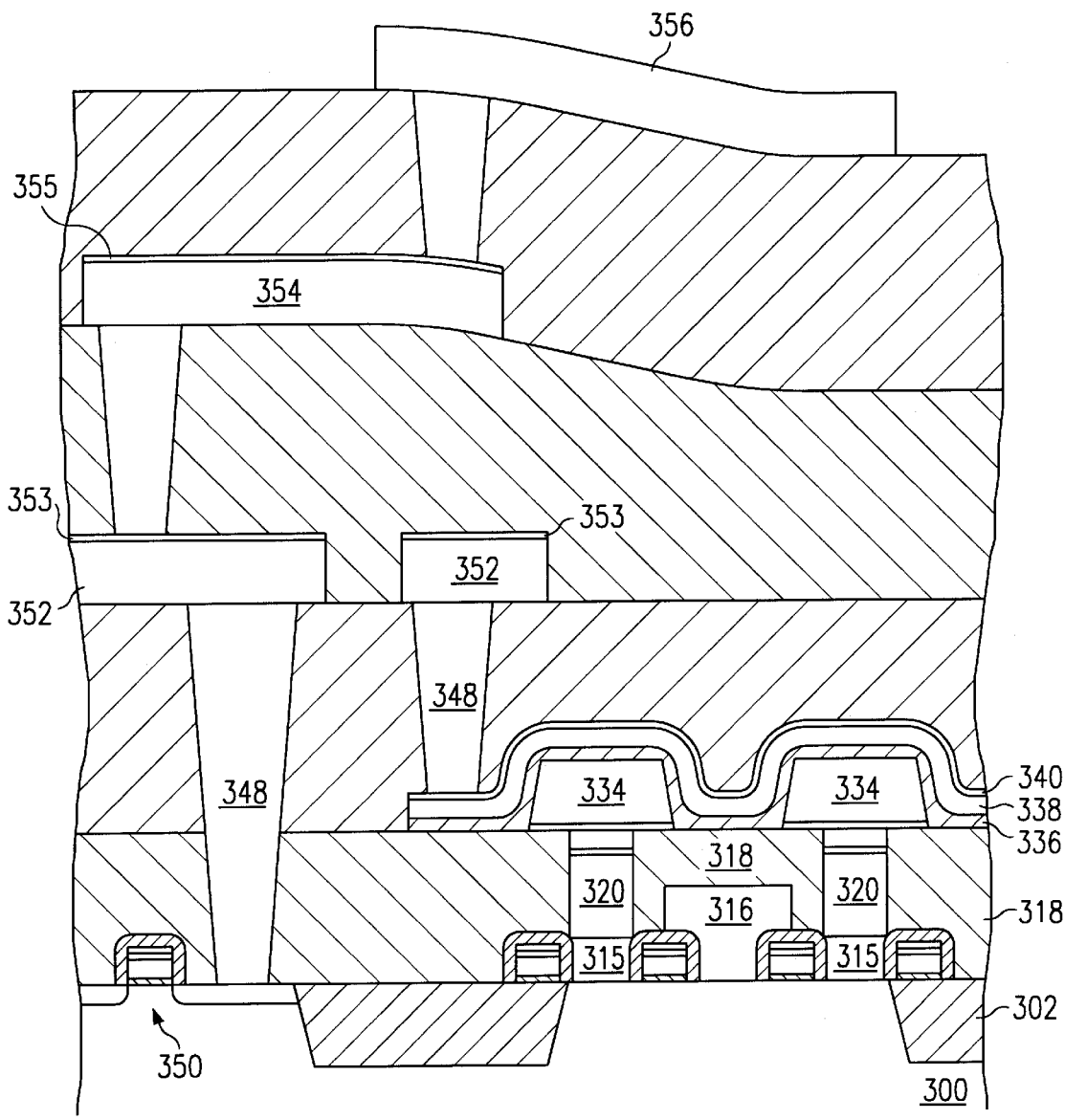
Figure 4A:
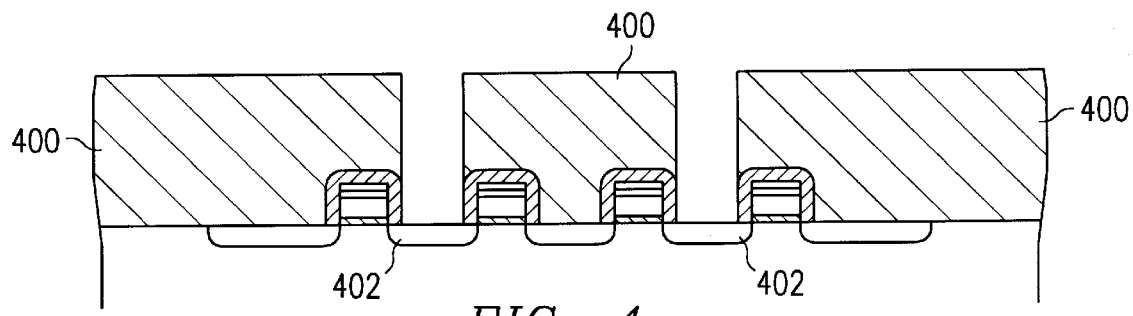
FIGS. 4a to 4I are cross-sectional diagrams at various stages of a process for forming a capacitor-under-bitline DRAM cell.
Figure 4B:
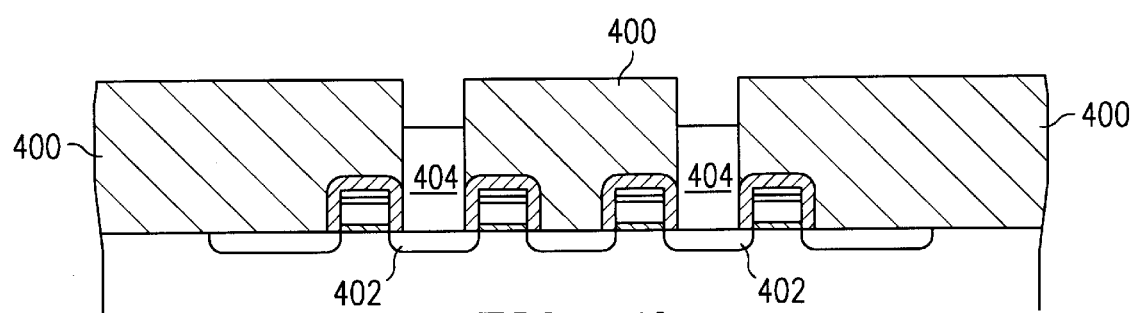
Figure 4C:
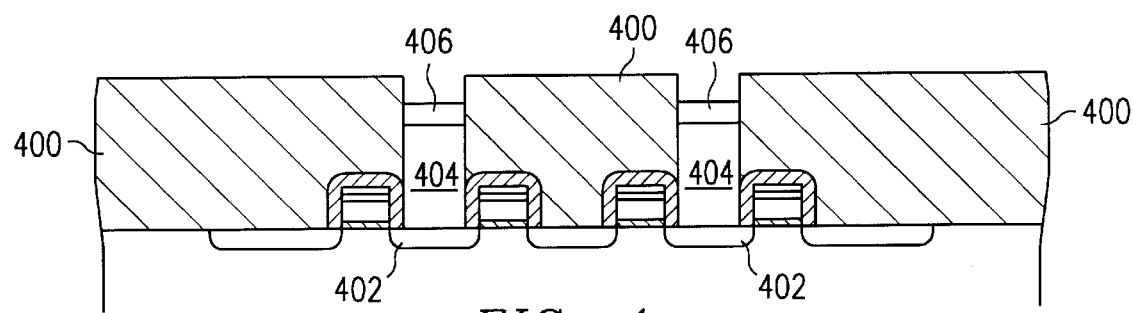
Figure 4D:
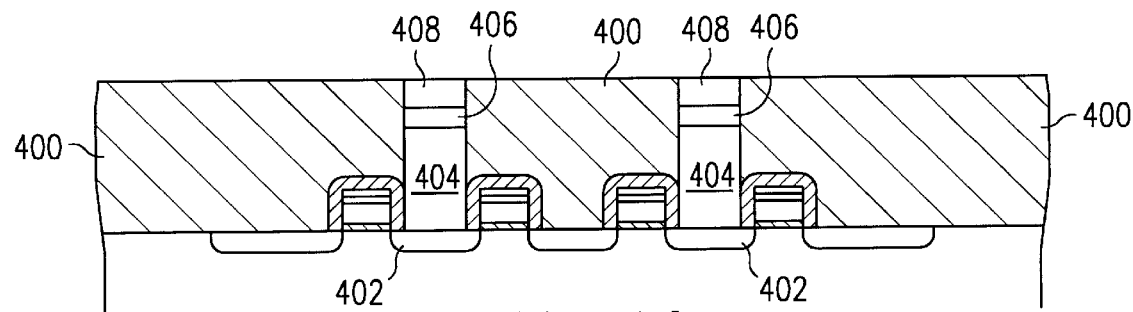
Figure 4E:
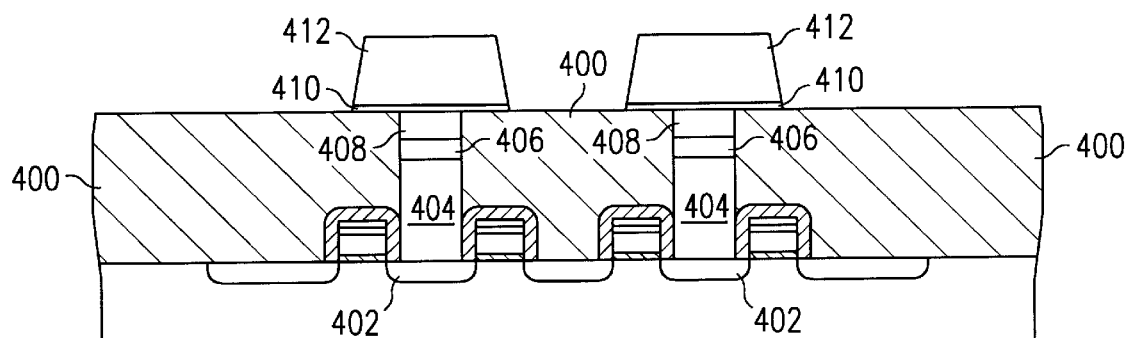
Figure 4F:
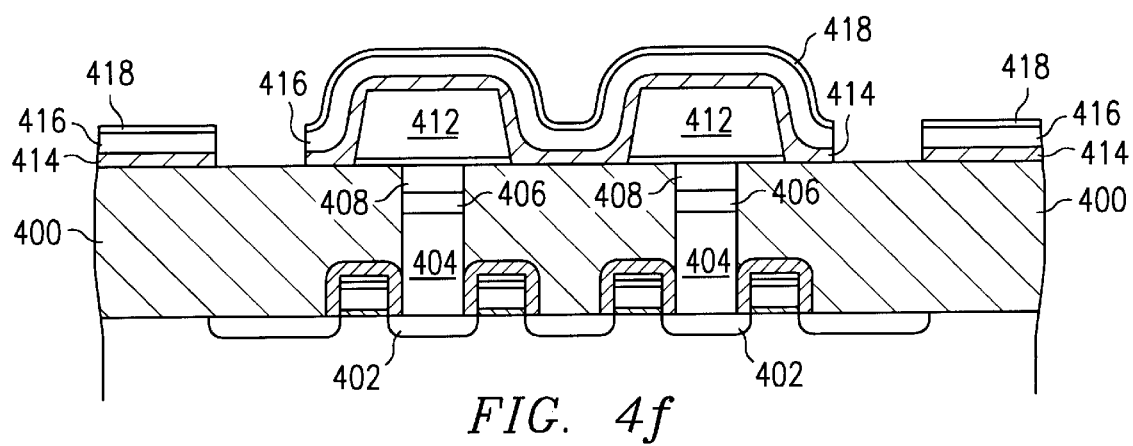
Figure 4G:
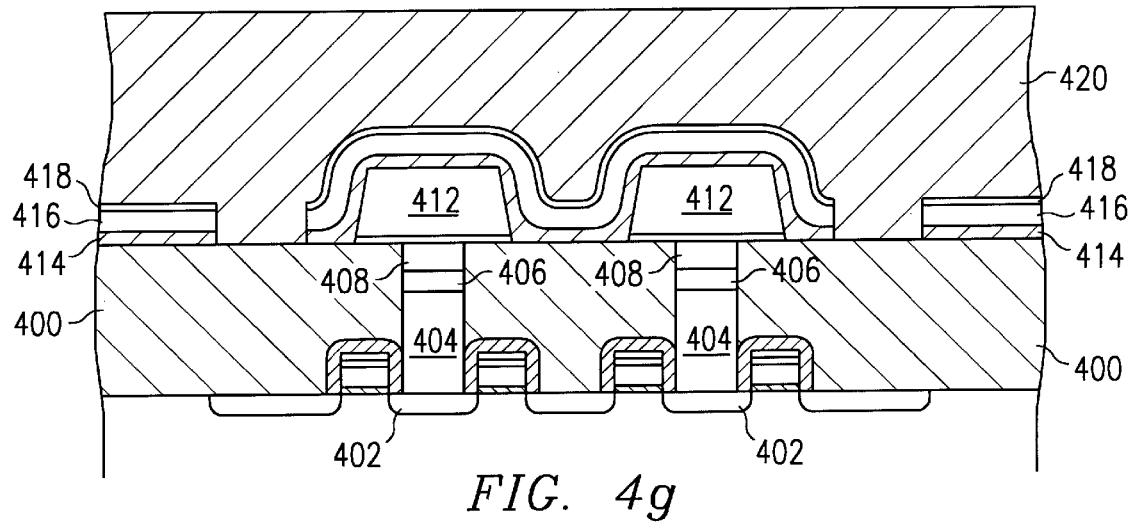
Figure 4H:
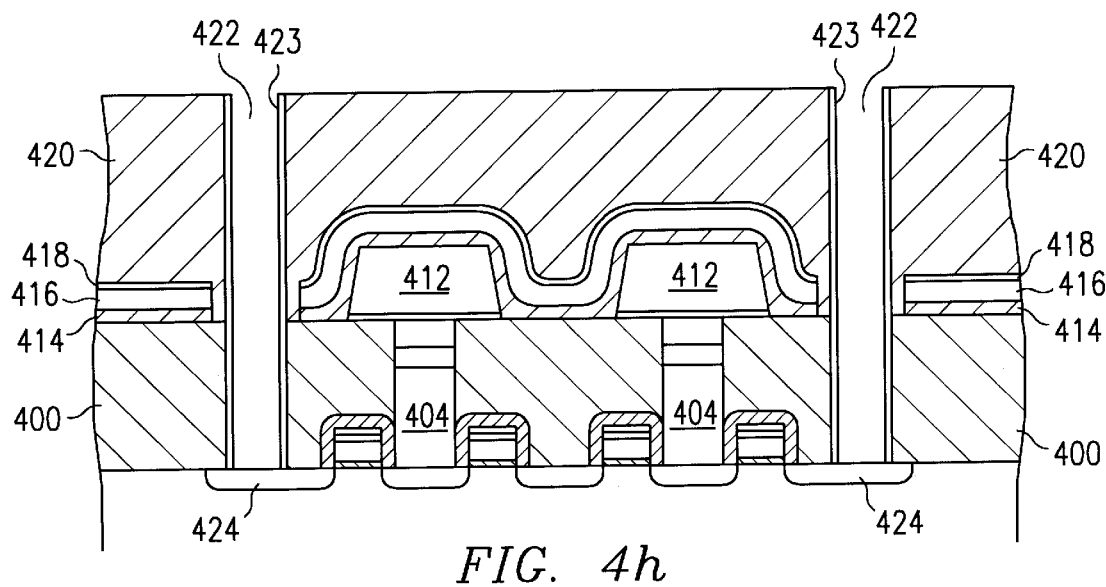
Figure 4I:
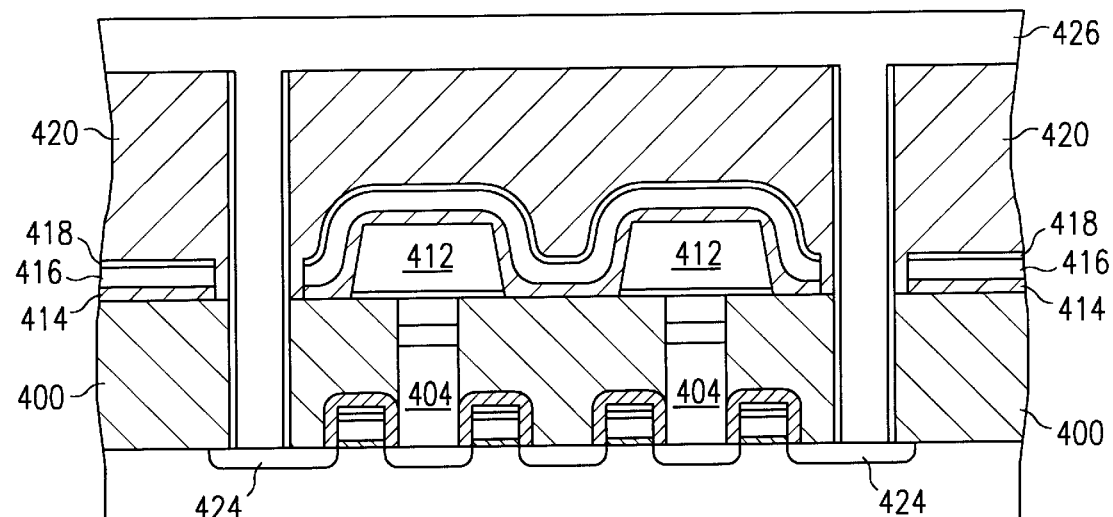

FIGS. 3a–3o illustrate the steps of an embodiment fabrication method for a DRAM in cross-sectional elevation view at the memory cell array.

(a) Start with a silicon substrate 300 (or silicon-on-insulator substrate) with shallow trench isolation 302 and twin wells for CMOS periphery circuitry and the memory cell array. Perform threshold adjustment implants (which may differ for cell transistors and various peripheral transistors), and form gate dielectric 304. Deposit tungsten silicide coated polysilicon gate material and a silicon dioxide layer, then pattern the layers to form oxide-topped gates 306 plus peripheral transistor gates and gate-level interconnects. See FIG. 3a.

(b) Perform lightly-doped-drain implants, and then form sidewall dielectric 308 on the gates by deposition plus anisotropic etching. Introduce dopants to form sources 310 and drains 312 including peripheral source/drains to complete the transistor level. Cover the structure with a planarized dielectric layer 314 (such as borophosphosilicate glass). See FIG. 3b.

(c) Photolithographically define and etch holes (vias) in the planarized dielectric down to sources 312. Blanket deposit in situ p-doped polysilicon and etch back to form stems 315 in the holes. Photolithographically define and etch holes in the planarized dielectric down to the drains 310. Blanket deposit in situ doped polysilicon and then a tungsten silicide cap, and pattern it to form bitlines 316 connecting to drains. Form planarized above-bitline dielectric 318, which may contain an etchstop sublayer (e.g., sublayers of oxide and nitride), but is preferably 500 nm of $SiO_2$ formed from tetraethyloxysilane precursor. See FIG. 3c.

(d) Form capacitor storage node contact opening in planarized above-bitline dielectric 318. Fill opening with polysilicon 320. Planarize the polysilicon and remove any excess from the surface of above-bitline dielectric 318 with a chemical mechanical polishing technique, for example. See FIG. 3d.

(e) Remove polysilicon 320 from the opening to a depth in the range of approximately 20 nm to 50 nm. A titanium silicide layer is then formed at the top of the remaining polysilicon plug using the following process, for example. Perform silicon deglaze by using hydrofluoric acid to remove the native oxide. Deposit titanium, then perform a rapid thermal anneal at about 725° C. in a nitrogen atmosphere to cause a reaction between the titanium and silicon. Remove unreacted titanium and Ti—N.

Sputter deposit $(Ti_{0.7}Al_{0.3})$—N to fill the remainder of the space created by the removal of polysilicon 320 and to blanket the surface of above-bitline dielectric 318. Planarize the barrier material and remove it from the surface of the bitline dielectric with a planarizing technique such as CMP. This creates a plug comprising polysilicon portion 320 and Ti—Al—N barrier portion 322, which are separated by silicide portion 321. See FIG. 3e. The presence of barrier 322 provides at least two significant advantages: 1) the polysilicon plug/barrier and the electrode/barrier interfaces are protected from the oxidizing atmosphere present during BST deposition, for example; and 2) the polysilicon plug would be protected by the oxidation resistant barrier after bottom electrode patterning even in case of lithographic misalignment, a significant concern for small geometries.

(f) Deposit a thin adhesion-promoting layer 324 of $(Ti_{0.7}Al_{0.3})$—N (approximately 3 nm) to cover the structure, followed by a 300 nm bottom electrode layer 326 of platinum. Both layers can be formed through sputter deposition. See FIG. 3f.

An alternative to the recessed barrier approach described above in steps (e) and (f) is the planar approach described above and in FIGS. 2a to 2e. In the planar approach, barrier layer 322 is simply formed over the plug 320, rather than in a recess formed by a removal of a portion of the plug. No polysilicon 320 is removed; instead, the barrier layer contacts the top of the plug and also serves as the adhesion-promoting layer between the subsequently-applied platinum and the above-bitline dielectric layer 318. The barrier in the planar approach occupies the position of the adhesion-promoting layer 324 in the structure of FIGS. 3f to 3o. The barrier layer differs only by having a thickness of approximately 20 nm or less, as opposed to the much thinner adhesion-promoting layer. The remaining process steps are unaffected by this alternative approach.

(g) Deposit an approximately 50 nm hardmask layer 328 of Ti—Al—N, to cover bottom electrode layer 326. Deposit an anti-reflection coating (ARC) layer 329, comprising Si—O—N or an organic layer, for example. Deposit and pattern photoresist 330 to form the bottom electrodes. See FIG. 3g. Examples of alternative hardmask materials include the following: Ti—N, Ta—N, Ta—Al—N, Ti—Si—N, W—Si—N, Ru—N, W—N, Ru—Al—N, Ru—Si—N, Cr—N, Cr—Al—N, Mo—N, Mo—Al—N, Mo—Si—N, V—N, V—Si—N, V—Al—N, Hf—N, Hf—Al—N, ternary (or greater) nitrides (such as Ta—Si—N, Ta—B—N, Ti—B—N), Zr—N, Y—N, Sc—N, La—N, Al—N, doped Al—N, Mg—N, Ca—N, Sr—N, Ba—N, alloys of the above with Ti—N, Ga—N, Ni—N, Co—N, Ta—N, and W—N. A class of alternative hardmask materials includes all of the above without nitrogen, e.g., Ti, V—Al, and so forth. Additional alternative hardmask materials include noble-metal-insulator alloys such as Pt—Si—N, Pd—Si—O, Pd—Si—O, Pd—B—(O,N), Pd—Al—N, Ru—Si—(O,N), Ir—Si—O, Re—Si—N, Rh—Al—O, Au—Si—N, and Ag—Si—N. Note that the hardmask layer may comprise multiple layers of different materials or combinations of the above materials.

(h) Remove the portion of hardmask layer 328 and ARC layer 329 left uncovered by photoresist 330 using a relatively high-pressure, low RF bias power, chlorine-based plasma. This etch is performed in an electron cyclotron resonance or helicon high density plasma etcher, for example, under the following conditions: pressure 5.0 mTorr; source power 1500 W; RF bias power 250 W; and $Cl_2$ flow rate of 40 sccm. Photoresist 330 is then ashed in an $O_2$ plasma and the ARC layer is removed (ARC layer 329 can optionally be left on as part of the hardmask). The removal of the photoresist and ARC leaves hardmask patterns 332 on bottom electrode layer 326. See FIG. 3h.

(i) Remove the portion of bottom electrode layer 326 not covered by hardmask patterns 332 with a relatively low-pressure, high-RF bias nitrogen-based plasma. See FIG. 2d. This etch is performed in a helicon or electron cyclotron resonance high density plasma etcher, for example, under the following conditions: pressure 2.5 mTorr, source power 2000 W, RF bias power 700 W, $N_2$ flow rate of 20 sccm, $Cl_2$ flow rate of 10 sccm, and $O_2$ flow rate of 10 sccm. An overetch of between 40% and 90% is then performed. The electrode etch stops on the Ti—Al—N adhesion-promoting layer 324. This process results in fence-free bottom electrodes and no elaborate post-etch cleanup is required.

j) Remove the Ti—Al—N adhesion-promoting layer 324 from areas left uncovered by bottom electrodes 334 and hardmask 332. Etching of layer 324 and hardmask layer 332 is performed under the following conditions: pressure 5.0 mTorr; source power 1500 W; RF bias power 250 W; and $Cl_2$ flow rate of 40 sccm. An overetch is then performed under the same conditions. The overetch may extend into the interlayer or above-bitline dielectric 318, though this is not shown in FIG. 3j. This overetch can be advantageous in that the capacitor dielectric (e.g. BST) that is subsequently applied may more uniformly coat the bottom electrode 334, particularly near the bottom of the electrode, than if no overetch were employed. It is theorized that a structure with a BST layer that is continuous (i.e. is not required to fill a corner) at the Ti—Al—N 324 to dielectric 318 interface may suffer fewer stress-induced defects.

(k) Deposit an approximately 25 nm capacitor dielectric layer 336 of $Ba_{0.5}Sr_{0.5}TiO_3$ at about 500° C. using a technique such as RF magnetron sputtering or chemical vapor deposition. Then deposit an approximately 100 nm platinum top electrode field plate 338. See FIG. 3k.

(l) Deposit a $(Ti_{0.7}Al_{0.3})$—N covering and hardmask layer 340 of approximately 25 nm thickness over the platinum top electrode 338. Deposit and pattern photoresist 340 to define the boundaries of the top electrode field plate. See FIG. 3l.

(m) Remove the uncovered portions of Ti—Al—N layer 340 using a relatively high-pressure, low RF bias, chlorine-based plasma. This etch is performed under the following conditions: pressure 5.0 mTorr; source power 1500 W; RF bias power 250 W; and Cl$_2$ flow rate of 40 sccm. Remove the photoresist 342. Depending on the size of the capacitor array and conformality of the TiAlN mask, photoresist 342 can optionally be left on before the platinum electrode etch. Then, using the remaining Ti—Al—N as a hardmask, remove the exposed portion of top electrode field plate 338 and the underlying BST 336 using a relatively low-pressure, high-RF bias high-density plasma under the following conditions: pressure 2.5 mTorr, source power 2000 W, RF bias power 700 W, N$_2$ flow rate of 20 sccm, Cl$_2$ flow rate of 10 sccm, and O$_2$ flow rate of 10 sccm. See FIG. 3 m. The Ti—Al—N layer serves at least three functions: 1) it acts as a hardmask for the etching of the underlying top electrode layer; 2) it covers and encapsulates (except for the exposed edges) the platinum top electrode field plate 338 to prevent contamination of process equipment with platinum in subsequent process steps; and 3) it serves as an etch stop layer in the formation of via contacts between upper metal layers and the top electrode field plate.

(n) Deposit a 500 nm thick interlayer dielectric (e.g. PETEOS) over the cell array 344 and array periphery 346. Etch vias 348 to the top of the field plate and to the periphery transistors 350 using an interlayer dielectric etch chemistry, such as Ar/CF$_4$/CHF$_3$. Deposit a liner (e.g. Ti or TiN) and a metal such as tungsten or aluminum to fill vias 348 and form the first metal layer 352. See FIG. 3n.

(o) Subsequent metal layers such as the second metal layer 354 and third metal layer 356 could also benefit from the vias etch stop applied in step (n). For example, first metal layer 352 could be etched using a Ti—Al—N anti-reflection coating (ARC) 353 that also serves as a via etch stop for vias from the second metal layer 354. A Ti—Al—N ARC 355 used to form second metal layer 354 could be used as an effective etch stop for vias coupling the second metal layer to the third metal layer.

FIGS. 4a to 4i illustrate a preferred embodiment process for fabricating a capacitor-under-bitline memory cell. Begin with the transistors formed as in the process described above. A planarized dielectric layer 400 is formed over the structure. (e.g. from a TEOS precursor)

(a) Photolithographically define and etch holes (vias) in the planarized dielectric down to sources 402. See FIG. 4a.

(b) Blanket deposit in situ p-doped polysilicon and etch back to form stems 404 in the holes. See FIG. 4b. For a planar barrier, do not etch back the stems.

(c) Form a titanium silicide layer 406 at the top of the polysilicon plug using the following process, for example. Perform silicon deglaze by using hydrofluoric acid to remove the native oxide. Deposit titanium, then perform a rapid thermal anneal at about 725° C. in a nitrogen atmosphere to cause a reaction between the titanium and silicon. Remove unreacted titanium and Ti—N. See FIG. 4c.

(d) Sputter deposit (Ti$_{0.7}$Al$_{0.3}$)—N to fill the remainder of the space created by the removal of polysilicon 404 and to blanket the surface of the planarized dielectric 400. Planarize the barrier material and remove it from the surface of the bitline dielectric with a planarizing technique such as CMP. This creates a plug comprising polysilicon portion 404 and Ti—Al—N barrier portion 408, and separated by silicide portion 406. See FIG. 4d.

(e) Deposit a thin adhesion-promoting layer 410 of (Ti$_{0.7}$Al$_{0.3}$)—N (approximately 3 nm) to cover the structure, followed by a 300 nm bottom electrode layer 412 of platinum. Both layers can be formed through sputter deposition. Deposit a hardmask layer of Ti—Al—N (not shown) having a thickness of approximately 50 nm, to cover bottom electrode layer 412. Deposit an anti-reflection coating (ARC) layer (not shown), comprising Si—O—N or an organic layer, for example. Deposit and pattern photoresist (not shown) to form the bottom electrodes. Remove the portion of hardmask layer and ARC layer left uncovered by photoresist (ARC layer can optionally be left on as part of the hardmask). Remove the portion of bottom electrode layer 412 not covered by hardmask patterns with a relatively low-pressure, high-RF bias nitrogen-based plasma. This etch is performed in a helicon or electron cyclotron resonance high density plasma etcher, for example, under the following conditions: pressure 2.5 mTorr, source power 2000 W, RF bias power 700 W, N$_2$ flow rate of 20 sccm, Cl$_2$ flow rate of 10 sccm, and O$_2$ flow rate of 10 sccm. An overetch of between 40% and 90% is then performed. The electrode etch stops on the Ti—Al—N adhesion-promoting layer 410. This process results in fence-free bottom electrodes and no elaborate post-etch cleanup is required. Remove the Ti—Al—N adhesion-promoting layer 410 from areas left uncovered by bottom electrodes 412. Etching of layer 410 and the hardmask layer is performed under the following conditions: pressure 5.0 mTorr; source power 1500 W; RF bias power 250 W; and Cl$_2$ flow rate of 40 sccm. An overetch is then performed under the same conditions. See FIG. 4e.

(f) Deposit an approximately 25 nm capacitor dielectric layer 414 of Ba$_{0.5}$Sr$_{0.5}$TiO$_3$ at about 500° C. using a technique such as RF magnetron sputtering or chemical vapor deposition. Then deposit an approximately 100 nm platinum top electrode field plate 416. Deposit a (Ti$_{0.7}$Al$_{0.3}$)—N covering and hardmask layer 418 of approximately 25 nm thickness over the platinum top electrode 416. Deposit and pattern photoresist (not shown) to define the boundaries of the top electrode field plate. Remove the uncovered portions of Ti—Al—N layer 418. Then, using the remaining Ti—Al—N as a hardmask, remove the exposed portion of top electrode field plate 416 and the underlying BST 414. See FIG. 4f.

(g) Deposit and planarize a 500 nm thick interlayer dielectric 420 (e.g. PETEOS) over the structure. Etch bitline contact vias 422 to the drains 424 of the transistors. See FIG. 4h.

(h) Deposit titanium and use silicidation process described above in step (c) to form silicide (not shown) at transistor drains 424. Deposit a thin contact hole liner 423, preferably of SiO$_2$ and by a conformal CVD process, followed by a planar etch to remove the deposited dielectric on the drains of the transistors. See FIG. 4h.

(i) Deposit bitline conductor 426 such as tungsten or polysilicon to contact drains 424 and form the bitline. See FIG. 4i.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the embodiment memory circuits described herein could be embedded on an integrated circuit with a processor such as a microprocessor or digital signal processor. It is therefore intended that the appended claims encompass any such modifications or embodiments.

What is claimed is:

1. A method for etching a platinum surface, comprising the steps of:

(a) forming a hardmask comprising titanium, aluminum, and nitrogen on said platinum surface, said hardmask covering portions of said surface; and (b) removing platinum from uncovered portions of said surface with a plasma including a nitrogen-bearing species.

2. The method of claim 1, wherein said plasma further comprises an oxygen-bearing species.

3. The method of claim 1, wherein said step of forming a hardmask comprises the steps of;

depositing a masking layer comprising titanium, aluminum, and nitrogen on said platinum surface;

depositing an antireflective coating over said masking layer;

forming a photoresist mask over said antireflective coating, said photoresist mask exposing a portion of said antireflective coating;

removing the exposed portion of said antireflective coating to expose a portion of said masking layer;

removing the exposed portion of said masking layer to form said hardmask; and removing the photoresist mask using an ashing step in an $O_2$ plasma, wherein oxygen from said $O_2$ plasma combines with aluminum and titanium of said hardmask to passivate said hardmask.

4. A method for forming a capacitor electrode, comprising the step of:

(a) forming a platinum layer over a substrate;

(b) forming a hardmask comprising titanium, aluminum, and nitrogen on said platinum layer, said hardmask covering portions of said platinum layer;

(c) etching uncovered portions of said platinum layer in a plasma etcher with a plasma including a nitrogen-bearing species.

5. The method of claim 4, wherein said plasma further comprises an oxygen-bearing species.

6. A method for forming an integrated circuit, comprising the steps of;

forming a platinum layer over a semiconductor body;

forming a hardmask comprising titanium, aluminum, and nitrogen on said platinum layer, said hardmask covering portions of said platinum layer;

etching said platinum layer to remove uncovered portions of said platinum layer with a plasma including a nitrogen-bearing species, an oxygen-bearing species, and a chlorine-bearing species.

7. The method of claim 6, wherein said platinum layer forms a capacitor electrode.

8. The method of claim 6, wherein said step of forming a hardmask comprises the steps of;

depositing a masking layer comprising titanium, aluminum, and nitrogen on said platinum layer;

depositing an antireflective coating over said masking layer;

forming a photoresist mask over said antireflective coating, said photoresist mask exposing a portion of said antireflective coating;

removing the exposed portion of said antireflective coating to expose a portion of said masking layer;

removing the exposed portion of said masking layer to form said hardmask; and removing the photoresist mask using an ashing step in an $O_2$ plasma, wherein oxygen from said $O_2$ plasma combines with aluminum and titanium of said hardmask to passivate said hardmask.

* * * * *